(12) United States Patent
Kim et al.

(10) Patent No.: US 9,470,972 B2
(45) Date of Patent: Oct. 18, 2016

(54) MASK FOR PHOTOLITHOGRAPHY, METHOD FOR FABRICATING THE SAME AND METHOD FOR MANUFACTURING SEMICONDUCTOR DEVICE USING THE MASK

(71) Applicant: Samsung Electronics Co., Ltd., Suwon-si (KR)

(72) Inventors: Jong-Doo Kim, Yongin-si (KR); Se-Jin Park, Seoul (KR); Suk-Joo Lee, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 15 days.

(21) Appl. No.: 14/642,660

(22) Filed: Mar. 9, 2015

(65) Prior Publication Data

US 2016/0018727 A1 Jan. 21, 2016

(30) Foreign Application Priority Data

Jul. 16, 2014 (KR) .................. 10-2014-0089890

(51) Int. Cl.
| | | |
|---|---|---|
| *H01L 21/302* | (2006.01) | |
| *G03F 1/26* | (2012.01) | |
| *G03F 1/28* | (2012.01) | |
| *H01L 21/308* | (2006.01) | |

(52) U.S. Cl.
CPC . *G03F 1/26* (2013.01); *G03F 1/28* (2013.01); *H01L 21/3086* (2013.01)

(58) Field of Classification Search
CPC .............. G03F 1/00; G03F 1/26; G03F 1/32; G03F 1/36; G03F 1/48; G03F 1/54; G03F 1/28; H01L 21/3086; H01L 21/3088; H01L 21/3144

USPC ........ 438/706, 710, 714, 717, 736; 430/322, 430/323, 313
See application file for complete search history.

(56) References Cited

U.S. PATENT DOCUMENTS

| | | |
|---|---|---|
| 6,541,165 B1 | 4/2003 | Pierrat |
| 6,692,876 B2 | 2/2004 | Baggenstoss |
| 6,883,159 B2 | 4/2005 | Schenker et al. |
| 7,141,337 B2 | 11/2006 | Lin et al. |
| 7,153,614 B2 | 12/2006 | Imai et al. |
| 7,468,239 B2 | 12/2008 | Imai et al. |

(Continued)

FOREIGN PATENT DOCUMENTS

| | | |
|---|---|---|
| KR | 10-2005-0006414 | 1/2005 |
| KR | 10-2010-0007387 | 1/2010 |

(Continued)

*Primary Examiner* — Lan Vinh
(74) *Attorney, Agent, or Firm* — Muir Patent Law, PLLC

(57) ABSTRACT

A mask for photolithography and methods of manufacturing a mask and a semiconductor device are provided. The method of manufacturing a mask may comprise providing a substrate, forming a phase shift material layer on the substrate, forming a light blocking layer on the phase shift material layer, and forming a main pattern and a sub pattern on the substrate by patterning the phase shift material layer and the light blocking layer. The light blocking layer may be removed on the main pattern left on the light blocking layer remaining on the sub pattern. A semiconductor device may be manufactured using the mask to form a photoresist pattern on a semiconductor wafer. The pattern of the photoresist may be used to etch an object layer of the semiconductor wafer.

20 Claims, 13 Drawing Sheets

(56) References Cited

U.S. PATENT DOCUMENTS

| | | |
|---|---|---|
| 7,776,494 B2 | 8/2010 | Chen et al. |
| 7,846,616 B2 | 12/2010 | Schroeder et al. |
| 7,901,844 B2 | 3/2011 | Ha |
| 8,039,180 B2 | 10/2011 | Laidig et al. |
| 8,181,126 B2 | 5/2012 | Liebmann et al. |
| 8,399,157 B2 | 3/2013 | Ogadhoh |
| 8,592,105 B2 | 11/2013 | Jang et al. |
| 2004/0013948 A1 | 1/2004 | Lin et al. |
| 2005/0136340 A1 | 6/2005 | Baselmans et al. |
| 2006/0019176 A1 | 1/2006 | Kim et al. |
| 2008/0131790 A1* | 6/2008 | Chang ................. G03F 1/32 430/5 |
| 2008/0145771 A1* | 6/2008 | Yoon ................... G03F 1/32 430/5 |
| 2009/0220893 A1* | 9/2009 | Scheer ............... H01L 21/0337 430/314 |
| 2010/0009273 A1 | 1/2010 | Kim |
| 2011/0159411 A1* | 6/2011 | Olson ..................... G03F 1/26 430/5 |
| 2011/0202892 A1 | 8/2011 | Lee et al. |
| 2011/0294045 A1 | 12/2011 | Nagai et al. |
| 2012/0100465 A1* | 4/2012 | Jang ....................... G03F 1/50 430/5 |
| 2013/0266893 A1 | 10/2013 | Gyoda |
| 2014/0030638 A1 | 1/2014 | Choi |

FOREIGN PATENT DOCUMENTS

| | | |
|---|---|---|
| KR | 10-2010-0049518 | 5/2010 |
| KR | 10-2011-0094467 | 8/2011 |

* cited by examiner

MASK FOR PHOTOLITHOGRAPHY, METHOD FOR FABRICATING THE SAME AND METHOD FOR MANUFACTURING SEMICONDUCTOR DEVICE USING THE MASK

CROSS-REFERENCE TO RELATED APPLICATION

This application claims priority from Korean Patent Application No. 10-2014-0089890 filed on Jul. 16, 2014 in the Korean Intellectual Property Office, and all the benefits accruing therefrom under 35 U.S.C. 119, the contents of which in its entirety are herein incorporated by reference.

BACKGROUND

1. Field of the Disclosure

The present disclosure relates to a mask for photolithography and a method for fabricating the same.

2. Description of the Related Art

Photolithography processes are used in the industrial fields for flat panel displays, circuit boards, integrated circuits, and so on. In a photolithography process, a pattern is formed by irradiating light onto a photoresist layer coated on a substrate.

According to recent demands for fabricating semiconductor devices having micro patterns, photolithography techniques are being actively developed. Since a photomask distribution directly affects a wafer distribution, it is important to ensure a quality of a micro pattern formed on a photomask.

SUMMARY

The present disclosure provides a method for fabricating a mask for photolithography, which can improve a printing margin of sub-resolution assist features (SRAF) formed in the vicinity of a main pattern in forming a phase shift mask.

The present disclosure also provides a mask for photolithography, which is configured to improve a printing margin of sub-resolution assist features (SRAF) formed in the vicinity of a main pattern in forming a phase shift mask.

The present disclosure also provides a method for manufacturing a semiconductor device using a mask for photolithography which is configured to improve a printing margin of sub-resolution assist features formed in the vicinity of a main pattern of a phase shift mask.

These and other objects of the present inventive concept will be described in or be apparent from the following description of the preferred embodiments.

According to an aspect of the present inventive concept, there is provided a method for fabricating a mask for photolithography, the method including providing a substrate, forming a phase shift material layer on the substrate, forming a light blocking layer on the phase shift material layer, forming a main pattern on the substrate by removing a portion of the phase shift material layer and a portion of the light blocking layer, forming a sub pattern on the substrate by removing a portion of the phase shift material layer and a portion of the light blocking layer, and removing the light blocking layer remaining on the main pattern while not removing the light blocking layer remaining on the sub pattern.

Forming of the main pattern and the sub pattern may include forming a first photoresist layer pattern on the light blocking layer and removing the phase shift material layer and the light blocking layer on a region exposed by the first photoresist layer pattern. The removing of the light blocking layer remaining on the main pattern may include forming a second photoresist layer pattern to cover the sub pattern and to expose the main pattern.

The forming of the second photoresist layer pattern may include forming the second photoresist layer to cover the main pattern and the sub pattern, exposing the second photoresist layer only at one or more regions corresponding to the main pattern, and removing the exposed second photoresist layer. The second photoresist layer may include an etch stop layer. The sub pattern may be spaced apart from the main pattern. The sub pattern may be shaped to surround the main pattern. The phase shift material layer may include molybdenum (Mo) and silicon (Si). The light blocking layer may include chrome (Cr).

According to another aspect of the present inventive concept, there is provided a method for fabricating a mask for photolithography, the method including forming a phase shift material layer on a substrate, forming a light blocking layer on the phase shift material layer, forming a first photoresist layer on the light blocking layer, patterning the first photoresist layer, forming a main pattern and a sub pattern using the patterned first photoresist layer, the main pattern including a first phase shift material pattern and a first light blocking pattern and the sub pattern including a second phase shift material pattern and a second light blocking pattern, forming a second photoresist layer to cover the main pattern and the sub pattern, patterning the second photoresist layer to expose the main pattern while not exposing the sub pattern, and removing the first light blocking pattern included in the main pattern.

According to another aspect of the present disclosure, there is provided a method of manufacturing a semiconductor device, the method including providing a wafer comprising an object layer, coating a photoresist layer on the object layer, exposing the photoresist layer to a light source through a photo mask, developing the photoresist layer to form a photoresist pattern; and etching the object layer to form an object layer pattern using the photoresist pattern as an etch mask, wherein the photo mask comprises a substrate and a main pattern and a sub pattern formed on the substrate, wherein the main pattern comprises a partially transparent phase shift material and the sub pattern comprises an opaque material.

The partially transparent phase shift material may further comprise a molybdenum silicide. The opaque material may comprise chrome. The sub pattern may further comprise a partially transparent phase shift material. The partially transparent phase shift material may comprise a phase shift material and a molybdenum silicide. The opaque material may comprise chrome.

According to another aspect of the present disclosure, there is provided a method of manufacturing a semiconductor device comprising coating a photoresist layer on a wafer substrate, exposing the photoresist layer to a light source through a photo mask, developing the photoresist layer to form a photoresist pattern, and performing an etch corresponding to the photoresist pattern, wherein the photo mask comprises a photo mask substrate, a partially transparent pattern formed on the photo mask substrate and blocking at least half of light irradiated on the partially transparent pattern to form a shade behind the partially transparent pattern by a light irradiation, and a sub resolution assist feature formed on the photo mask substrate, wherein the partially transparent pattern comprises a phase shift material and the sub resolution assist feature comprises an opaque material.

The partially transparent pattern may further comprise a molybdenum silicide. The opaque material may comprise chrome. The sub resolution assist feature may further comprise a partially transparent phase shift material. The partially transparent phase shift material may comprise a phase shift material and a molybdenum silicide and the opaque material comprises chrome. The portion exposed by the photoresist pattern and etched using the photoresist pattern as a mask may be the wafer substrate.

BRIEF DESCRIPTION OF THE DRAWINGS

Example embodiments will be more clearly understood from the following detailed description taken in conjunction with the accompanying drawings. The figures represent non-limiting example embodiments as described herein.

DETAILED DESCRIPTION OF THE EMBODIMENTS

Figure 1:
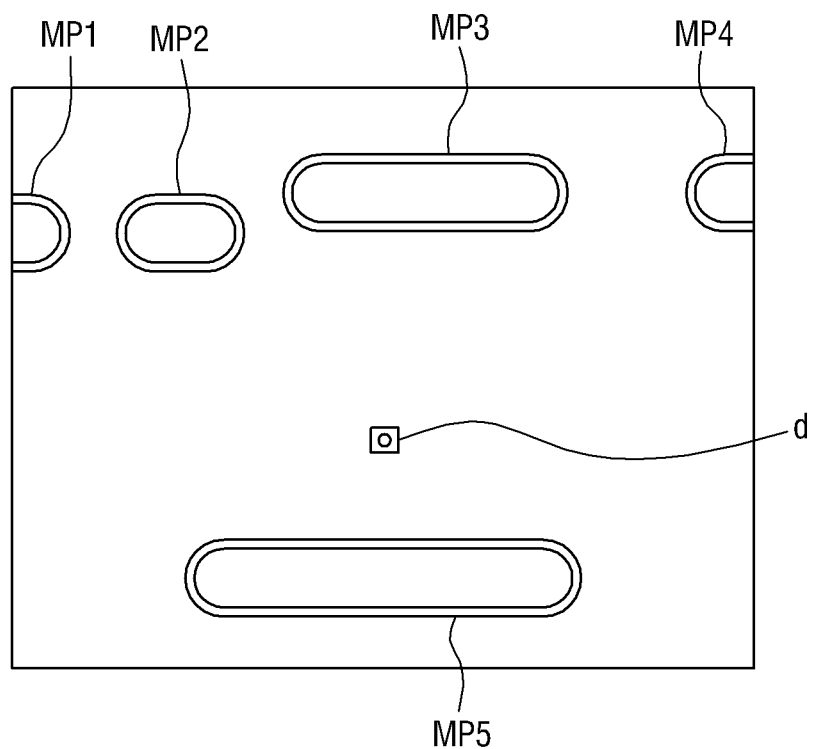
FIG. 1 is a diagram illustrating that SRAF based defects are formed on a wafer.

The present invention will now be described more fully hereinafter with reference to the accompanying drawings, in which preferred embodiments of the invention are shown. This invention may, however, be embodied in different forms and should not be construed as limited to the embodiments set forth herein. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

The present invention will be described with reference to perspective views, cross-sectional views, and/or plan views, in which preferred embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation.

In the mask for photolithography and the method for fabricating the same, which follow, a main pattern and a sub pattern adjacent to the main pattern are made of different materials in forming a phase shift mask (PSM), thereby improving a printing margin of the sub pattern on a wafer using a difference in the light transmittance between the main pattern and the sub pattern.

That is to say, the mask for photolithography according to an embodiment of the present inventive concept can improve the printing margin of a sub pattern while improving the resolution of a main pattern by forming the main pattern in a PSM type and forming the sub pattern in an opaque MoSi on glass (OMOG) type.

FIG. 1 is a diagram illustrating SRAF (sub-resolution assist features) based defects are formed on a wafer.

FIG. 1 shows exemplary resulting structure on a wafer after being processed using a conventional PSM (phase shift mask). A conventional PSM includes a main pattern and a sub pattern. The main pattern may be intended to form a main pattern or a real pattern on an object, for example patterning a photoresist layer on a wafer for subsequent patterning of a layer on the wafer, and the sub pattern may be intended to increase the degree of precision of the main pattern formed on the object. The sub pattern may not be intended to form a real pattern on an object, for example on a wafer. In order to fabricate a micro pattern on a wafer, the size of the sub pattern formed on the mask may be increased. In this case, if the size of the sub pattern is made too large, a pattern may be formed on the wafer by the sub pattern and the formed pattern may function as a defect. For example, the sub pattern may derive an unintended pattern or a defect (d) on a wafer.

As shown in FIG. 1, the defect d is created in forming a plurality of main patterns MP1 to MP5 on the wafer. The plurality of main patterns MP1 to MP5 are patterns intended by a user, while the defect d is a pattern that is not intended by the user.

Demands for forming micro patterns on a wafer are gradually increasing. To cope with the demands, a PSM mask may be used and a negative tone development (NTD) process may be employed. However, when the main pattern and the sub pattern of the mask are both formed in PSM types, such a defect d as shown in FIG. 1 may be created. To avoid this, according to an embodiment of the present inventive concept, the main pattern is formed using a PSM type blocking element(s) and the sub pattern is formed using an opaque type blocking element (e.g., MoSi on glass (OMOG) type blocking element).

Figure 2:
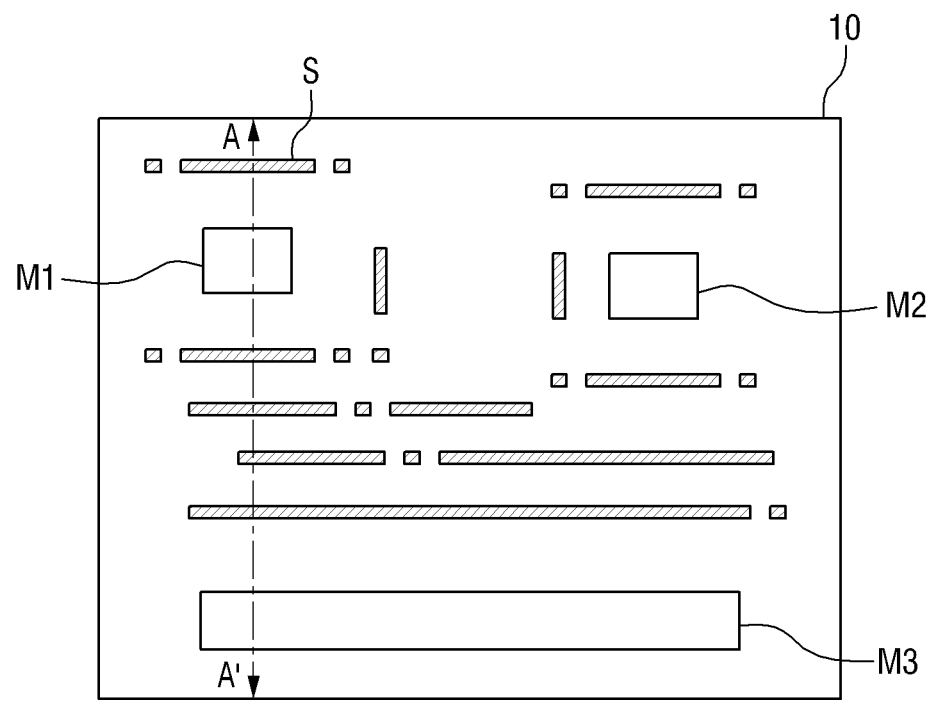
FIG. 2 is a layout view of a mask for photolithography according to an embodiment of the present inventive concept.
Figure 3:
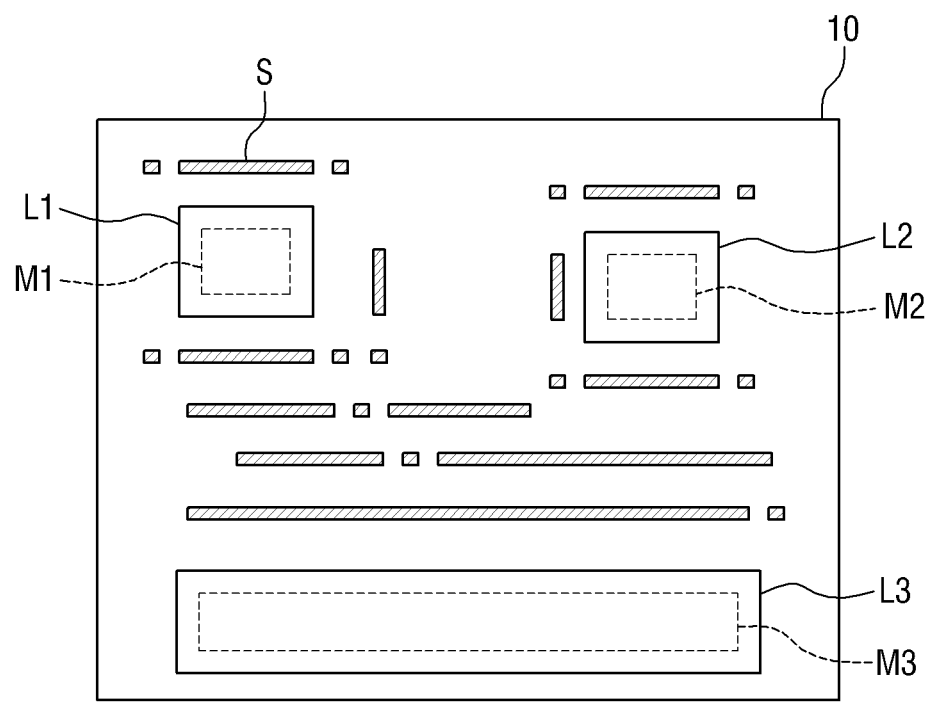
FIG. 3 illustrates a layout design process for fabricating a mask for photolithography according to an embodiment of the present inventive concept.
Figure 4:
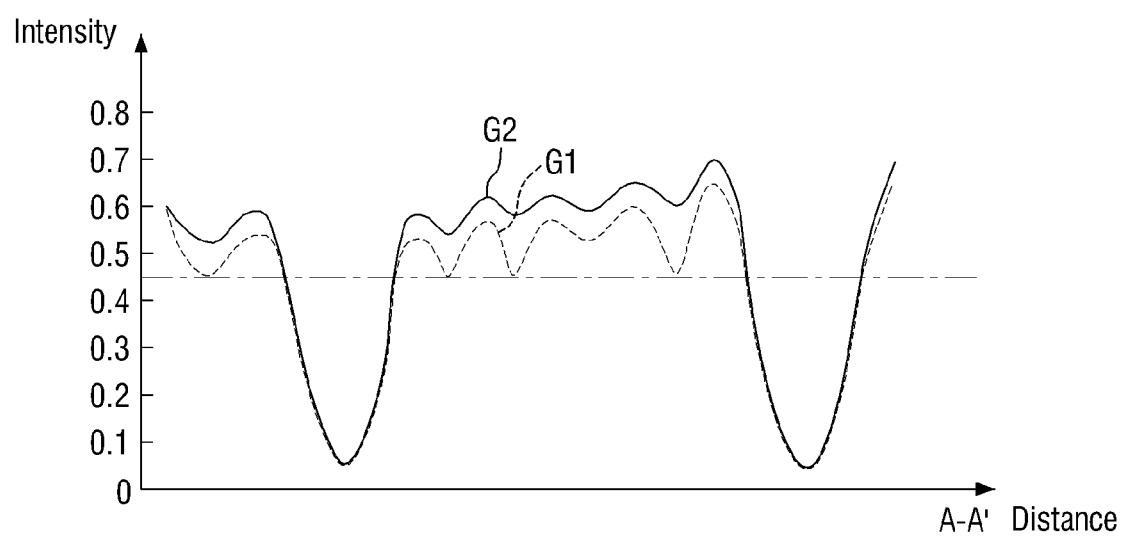
FIG. 4 is a graph for explaining an improved SRAF printing margin according to the present inventive concept.

FIG. 2 is a layout view of a mask for photolithography according to an embodiment of the present inventive concept, FIG. 3 illustrates an exemplary layout design process for fabricating a mask for photolithography according to an embodiment of the present inventive concept, and FIG. 4 is a graph for explaining an improved SRAF printing margin according to an embodiment of the present inventive concept.

Referring to FIG. 2, the mask for photolithography according to an embodiment of the present inventive concept includes main patterns M1, M2 and M3 and a sub pattern S formed on a substrate 10. Here, the sub pattern S may be a sub-resolution assist feature (SRAF) pattern. For example, the sub-resolution assist feature (SRAF) may have small enough dimensions so that it is insufficient to fully block light at any location beneath the SRAF (e.g., light may bend around the SRAF pattern to expose photoresist under the SRAF).

The sub pattern S may include a plurality of sub patterns, which may be spaced apart from the main patterns M1, M2 and M3. For example, the sub pattern S may be formed between each of the main patterns M1, M2 and M3.

Each of the main patterns M1, M2 and M3 may include a phase shift material layer, and the phase shift material layer may include, for example, molybdenum (Mo) and/or silicon (Si). During a photolithographic process, the phase shift material layer may transmit some percentage of light (e.g., less than 10%, such as about 6%) and shift the phase of such light to be approximately 180 degrees out of phase with light that passes through openings in the mask 10. The sub pattern S may include a phase shift material layer and a light blocking layer. In some examples, the sub pattern S includes a light blocking layer and does not include a phase shift material layer. In this example, the light blocking layer is formed on the phase shift material layer. The phase shift material layer included in the sub pattern S may include, for example, molybdenum (Mo) and/or silicon (Si). The light blocking layer included in the sub pattern S may include, for example, chrome (Cr).

The sub pattern S may be configured to surround the main patterns M1, M2 and M3, for example, but aspects of the present inventive concept are not limited thereto.

A layout design process for fabricating a mask for photolithography according to an embodiment of the present inventive concept will be described with reference to FIG. 3.

Layouts L1, L2 and L3 may be formed to cover regions where the main patterns M1, M2 and M3 are formed. The main patterns M1, M2 and M3 and the sub pattern S are first formed on the substrate 10 and only the light blocking layer formed on the main patterns M1, M2 and M3 is then removed; the light blocking layer formed on the sub pattern S may remain, thereby fabricating the mask for photolithography according to an embodiment of the present inventive concept.

During the manufacturing steps of making the mask 10, a layer of partially transparent PSM material may be deposited on a substrate and a layer of opaque material may be deposited on the PSM material. Both layers may be patterned according to a first etching process (e.g., by depositing and patterning a photoresist material layer on the opaque material layer and then performing an etch using the patterned photoresist as a mask). Then, a second photoresist material layer is formed on the whole surface of the substrate 10 to cover the main patterns M1, M2 and M3 and the sub pattern S. A second photolithography process may be performed to expose only the regions where the main patterns M1, M2 and M3 are formed. Accordingly, only the light blocking layer formed on the main patterns M1, M2 and M3 may be exposed to the outside and the light blocking layer formed on the sub pattern S may not be exposed to the outside. A subsequent etch step may remove only the light blocking layer of the main patterns M1, M2 and M3 and allow the underlying PSM layer of the main patterns M1, M2 and M3 to remain.

Since the mask for photolithography according to an embodiment of the present inventive concept is fabricated by removing only the light blocking layer formed on the main patterns M1, M2 and M3, layouts L1, L2 and L3 are designed, the layouts L1, L2 and L3 covering only regions including the regions where the main patterns M1, M2 and M3 are formed and predetermined portions adjacent to the main patterns M1, M2 and M3. For example, only the light blocking layer formed on the main patterns M1, M2 and M3 may be exposed by performing the photolithography process. Then, the mask for photolithography according to an embodiment of the present inventive concept may be completed by removing only the light blocking layer formed on the main patterns M1, M2 and M3.

Referring to FIG. 4, a printing margin of the sub pattern S can be improved by performing the photolithography process using the mask for photolithography according to an embodiment of the present inventive concept. FIG. 4 illustrates light transmittance of each of the main patterns M1, M2 and M3 and the sub patterns S arranged along the line A-A' of FIG. 2. As understood from comparison between a graph (G2) (solid line) illustrating a case where the sub pattern S is formed in an OMOG (MoSi on glass) type according to an embodiment of the present inventive concept and a graph (G1) (dashed line) illustrating a case where the sub pattern S is formed in a PSM type according to the prior art, light blocking characteristics of the sub pattern S according to embodiments of the present inventive concept can be improved.

For example, in case the critical intensity value is about 0.45 (as indicated by the horizontal alternating long and short dash line in FIG. 4) a photoresist layer (e.g., on a wafer to pattern a layer on the wafer) will be removed in the portion where irradiated light intensity is lower than 0.45 (the critical intensity) during a subsequent development process (e.g., when the photoresist material is negative in this example, a negative tone development process is applied to the wafer). The photoresist layer remains in the portion where irradiated light intensity is higher than the critical intensity (e.g., higher than 0.45). For example, these resulting pattern formed in the photoresist on the wafer may be used to etch a layer (e.g., an object layer, such as an insulating layer) under the photoresist pattern to form via holes and/or wiring patterns (e.g., subsequently formed in the insulator by a damascene process).

In FIG. 4, graph G1 shows that the light intensity becomes close to the critical intensity in locations corresponding to the sub patterns, which may cause undesired real holes or opening patterns in the photoresist layer during subsequent development process, thereby causing a defect pattern. On the other hand, graph G2 shows that the light intensity is higher than the critical intensity in all areas corresponding to the sub patterns. Therefore, the photoresist layer may remain throughout the areas corresponding to the sub patterns. Opening patterns may be well defined in the areas corresponding the main patterns using PSM for the main patterns of the mask while opaque sub patterns may be used that have reduced risk of causing a defect.

In an alternative example that uses a mask of the disclosed embodiments to irradiate a positive photoresist material, photoresist material may remain in the areas corresponding to the lower intensity locations (e.g., below the critical density) in FIG. 4 and be removed in areas corresponding to the higher intensity locations (e.g., above the critical density). In this case, the sub pattern area of the graph G1 may correspond to areas where photoresist layer undesirably remains during a subsequent developing process, which may cause a defect pattern in a subsequent patterning process of the layer disposed below the photoresist layer.

OMOG type sub pattern may include, for example, a phase shift material layer pattern and a light blocking layer pattern formed on the phase shift material layer pattern. PSM type sub pattern may include, for example, a phase shift material layer pattern. The phase material layer patterns of the OMOG type sub pattern and the PSM type sub pattern may include, for example, molybdenum and/or silicon.

Accordingly, if the photolithography process is performed using the mask according to an embodiment of the present inventive concept, the printing margin of the sub pattern S can be improved.

Figure 5:
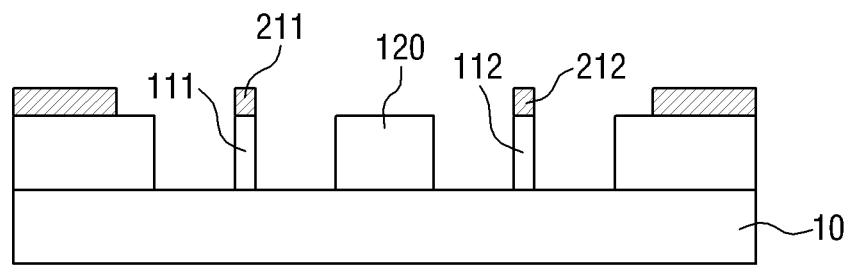
FIG. 5 is a cross-sectional view of a mask for photolithography according to an embodiment of the present inventive concept.

FIG. 5 is a cross-sectional view of a mask for photolithography according to an embodiment of the present inventive concept.

Referring to FIG. 5, the mask for photolithography according to an embodiment of the present inventive concept may include a substrate 10, a main pattern 120, a first sub pattern 111, a second sub pattern 112, a first light blocking layer 211, and a second light blocking layer 212.

The substrate 10 may be, for example, a quartz substrate including fusible silica or silicon dioxide ($SiO_2$).

The main pattern 120 is formed on the substrate 10. The main pattern 120 may be a gate pattern, a metal wiring pattern, a device isolation pattern or a via hole pattern to be formed on a wafer.

The main pattern 120 may be formed of a single layer or a single film. The main pattern 120 may shift the phase of light irradiated. For example, the main pattern 120 may include a phase shift material. For example, the phase shift material may include at least one of molybdenum (Mo), silicon (Si), titanium (Ti), tantalum (Ta), nickel (Ni), aluminum (Al), oxygen ($O_2$), and nitrogen ($N_2$).

In addition, the main pattern 120 may allow light in a particular wavelength band to be transmitted while blocking light in other wavelength bands. For example, i-line light may be transmitted and light in other wavelength bands may be blocked by the main pattern 120. For example, the main pattern 120 allows the light having a wavelength of 365 nm or a wavelength band around 365 nm to pass through and blocks the light in other wavelength bands. Therefore, the main pattern 120 may demonstrate characteristics of a band pass filter allowing the light in a particular wavelength band to be transmitted.

The first sub pattern 111 is formed on the substrate 10. The first sub pattern 111 may be spaced a predetermined distance apart from the main pattern 120. The predetermined distance between the first sub pattern 111 and the main pattern 120 may vary or be standardized according to user's demand.

Like the main pattern 120, the first sub pattern 111 may also include a phase shift material. For example, the phase shift material may include at least one of molybdenum (Mo), silicon (Si), titanium (Ti), tantalum (Ta), nickel (Ni), aluminum (Al), oxygen ($O_2$), and nitrogen ($N_2$).

The second sub pattern 112 is formed on the substrate 10. Like the first sub pattern 111, the second sub pattern 112 may also be spaced a predetermined distance apart from the main pattern 120. The predetermined distance between the second sub pattern 112 and the main pattern 120 may vary or be standardized according to user's demand.

Like the main pattern 120 and the first sub pattern 111, the second sub pattern 112 may also include a phase shift material. For example, the phase shift material may include at least one of molybdenum (Mo), silicon (Si), titanium (Ti), tantalum (Ta), nickel (Ni), aluminum (Al), oxygen ($O_2$), and nitrogen ($N_2$).

Since the main pattern 120, the first sub pattern 111, and the second sub pattern 112 are formed by dividing a single layer or a single film, they may include the same material. For example, the main pattern 120, the first sub pattern 111, and the second sub pattern 112 may be formed by patterning one or more layers formed by the same deposition process.

The first light blocking layer 211 is formed on the first sub pattern 111. The first light blocking layer 211 may include chrome (Cr) blocking substantial light or having light transmittance of 0%, and the first light blocking layer 211 may substantially or completely block the light, thereby minimizing the effect of light. For example, the first light blocking layer 211 may reduce flare noises.

The second light blocking layer 212 is formed on the second sub pattern 112. Like the first light blocking layer 211, the second light blocking layer 212 may also include chrome (Cr). For example, the second light blocking layer 212 may substantially or completely block the light, thereby minimizing the effect of light. For example, the second light blocking layer 212 may reduce flare noises.

Hereinafter, a method for fabricating a mask for photolithography according to an embodiment of the present inventive concept will be described.

Figure 6:
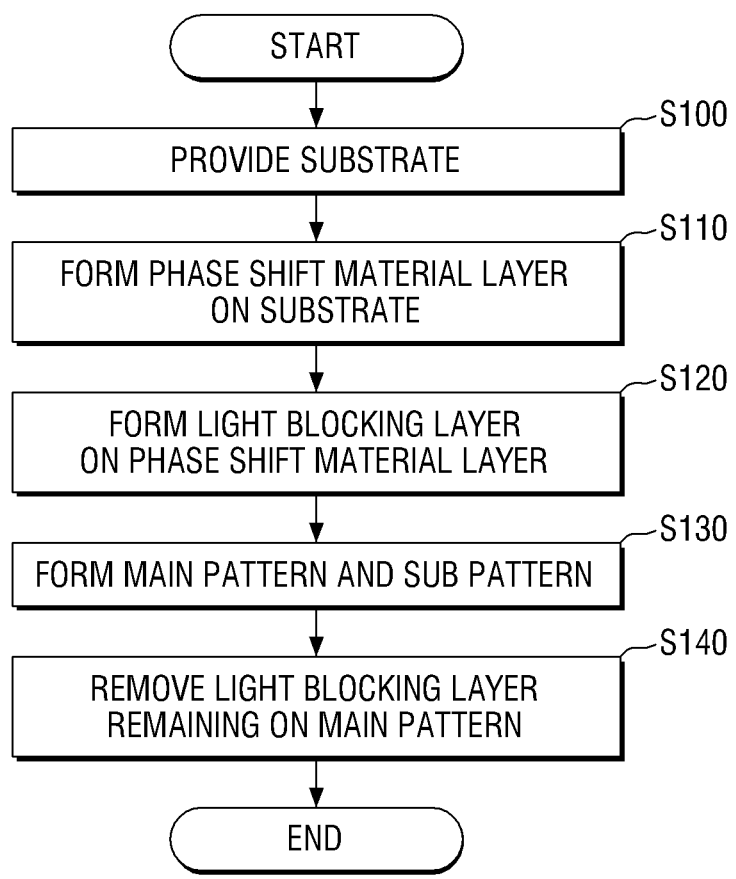
FIG. 6 is a flowchart sequentially illustrating a method for fabricating a mask for photolithography according to an embodiment of the present inventive concept.

FIG. 6 is a flowchart sequentially illustrating a method for fabricating a mask for photolithography according to an embodiment of the present inventive concept and FIGS. 7 to 13 illustrate intermediate process steps of the method for fabricating a mask for photolithography according to an embodiment of the present inventive concept.

Referring to FIGS. 5 to 13, the method for fabricating a mask for photolithography according to an embodiment of the present inventive concept may include providing a substrate 10 (S100).

The substrate 10 may be, for example, a quartz substrate including fusible silica or silicon dioxide ($SiO_2$).

Next, a phase shift material layer 100 is formed on the substrate 10 (S110). The phase shift material layer 100 may become a main pattern 120, a first sub pattern 111 and a second sub pattern 112 in a subsequent process.

The phase shift material layer 100 may include, for example, at least one of molybdenum (Mo), silicon (Si), titanium (Ti), tantalum (Ta), nickel (Ni), aluminum (Al), oxygen ($O_2$), and nitrogen ($N_2$).

Next, a light blocking layer 200 is formed on the phase shift material layer 100 (S120). The light blocking layer 200 may become a first light blocking layer 211 and a second light blocking layer 212 in a subsequent process. The light blocking layer 200 may include, for example, chrome (Cr).

Next, a portion of the phase shift material layer 100 and a portion of the light blocking layer 200 are removed, thereby forming the main pattern 120, the first sub pattern 111 and the second sub pattern 112 on the substrate 10 (S130).

Figure 7:
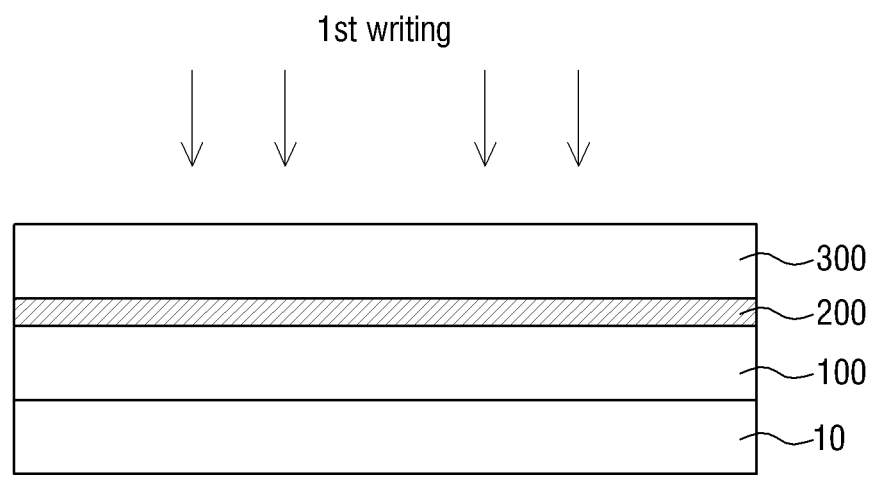
FIGS. 7 to 13 illustrate intermediate process steps of the method for fabricating a mask for photolithography according to an embodiment of the present inventive concept.
Figure 8:
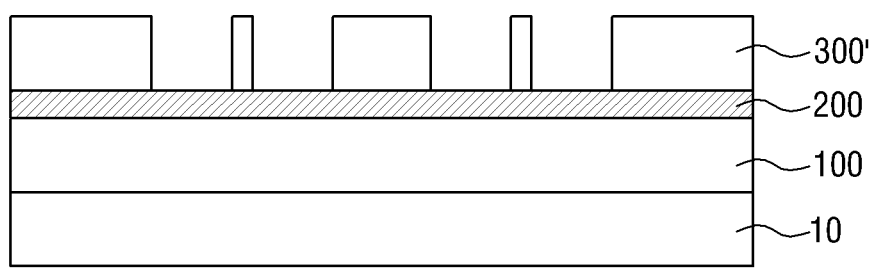

Referring to FIGS. 7 and 8, a first photoresist layer 300 is formed on the light blocking layer 200 and a first writing process is then performed, thereby forming a first photoresist layer pattern 300'.

Figure 9:
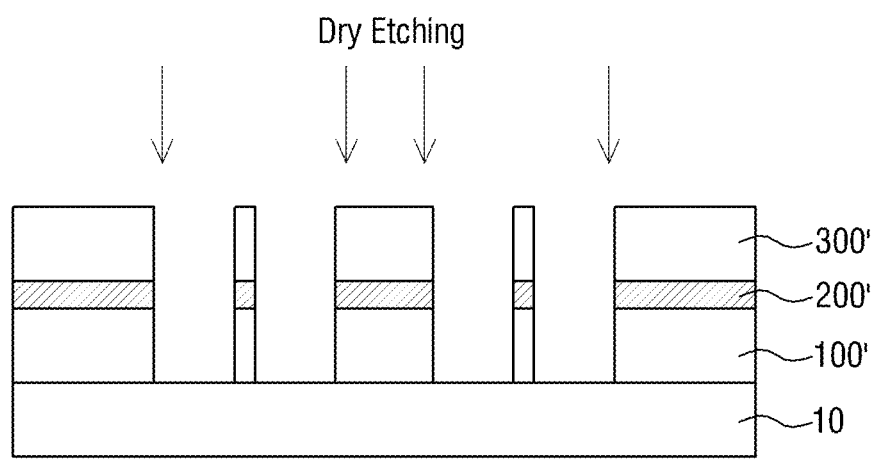
Figure 10:
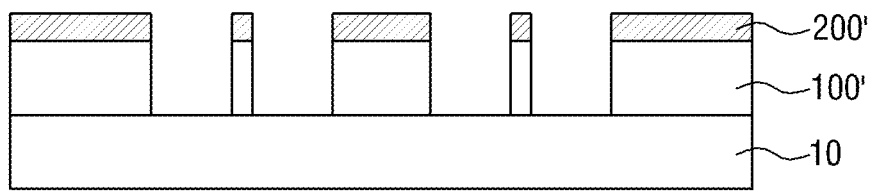

Referring to FIGS. 9 and 10, the phase shift material layer 100 and the light blocking layer 200 in a region exposed by the first photoresist layer pattern 300' are removed. For example, a dry etching process is performed using the first photoresist layer pattern 300' and a portion of the phase shift material layer 100 and a portion of the light blocking layer 200 are removed, thereby forming a phase shift material layer pattern 100' and a light blocking layer pattern 200'. Here, the phase shift material layer pattern 100' includes the main pattern 120, the first sub pattern 111 and the second sub pattern 112.

Next, a light blocking layer 220 remaining on the main pattern 120 is removed (S140). However, the first light blocking layer 211 remaining on the first sub pattern 111 and the second light blocking layer 212 remaining on the second sub pattern 112 are not removed.

Figure 11:
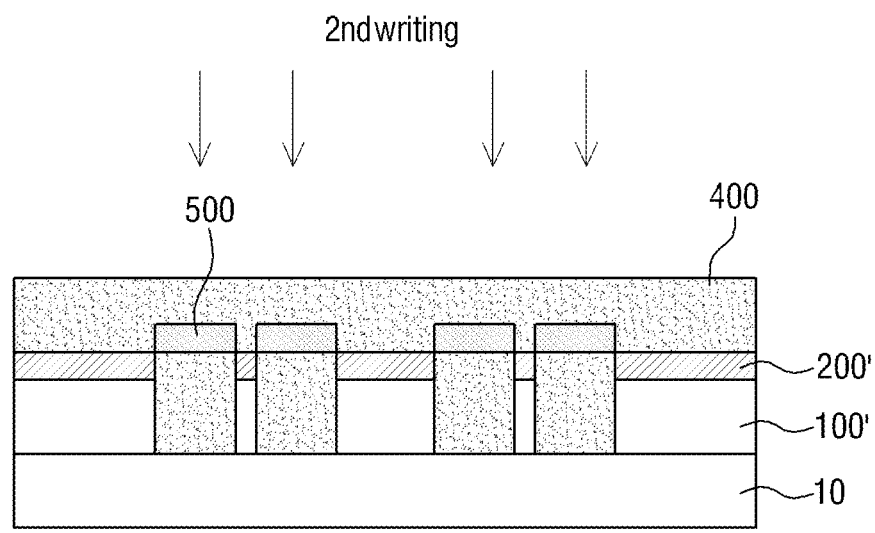
Figure 12:
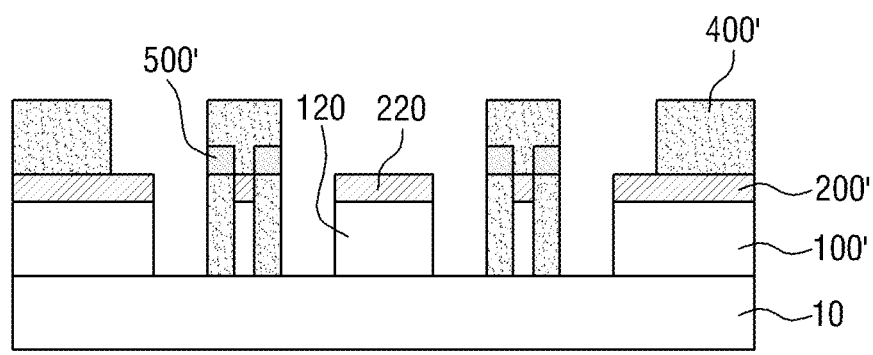

Referring to FIGS. 11 and 12, a second photoresist layer pattern 400' is formed, the second photoresist layer pattern 400' covering the first sub pattern 111 and the second sub pattern 112 while not covering the main pattern 120, thereby removing the light blocking layer 220 remaining on the main pattern 120.

Here, in order to form the second photoresist layer pattern 400', the second photoresist layer 400 is formed on the whole surface of the substrate 10 to cover the main pattern 120, the first sub pattern 111 and the second sub pattern 112. Then, a second writing process is performed, thereby forming the second photoresist layer pattern 400'. The second photoresist layer pattern 400' exposes the light blocking layer 220 formed on the main pattern 120 to the outside.

In order to form the second photoresist layer pattern 400', a layout design process may be performed to form layouts (L1 to L3 of FIG. 3) covering only a region where the main pattern 120 is formed. The second photoresist layer 400 in the region covered by the layouts is removed, thereby forming the second photoresist layer pattern 400'.

Here, the second photoresist layer 400 may include an etch stop layer 500. The etch stop layer 500 may exist as an etch stop layer pattern 500' in a subsequent process. The etch stop layer pattern 500' may provide etching points to allow the first light blocking layer 211 remain on the first sub pattern 111 and the second light blocking layer 212 on the second sub pattern 112 during a strip process for removing the second photoresist layer pattern 400'.

Figure 13:
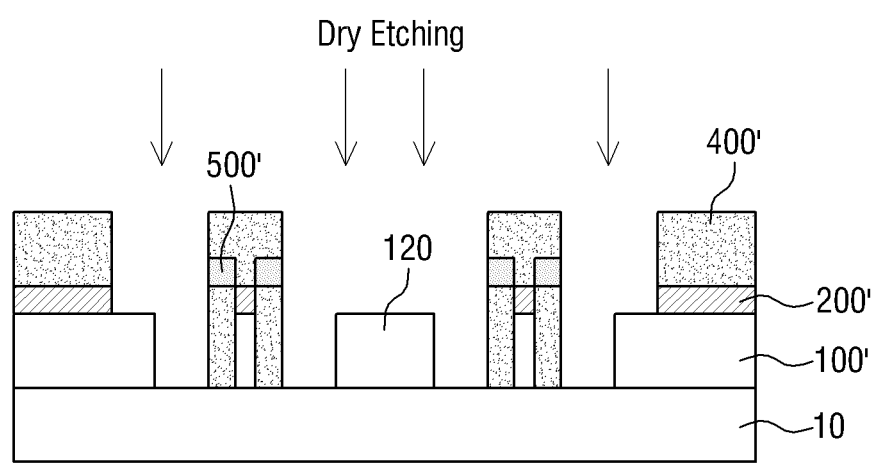

Referring to FIG. 13, a dry etching process is performed using the second photoresist layer pattern 400' and the light blocking layer 220 formed on the main pattern 120 is removed.

Hereinafter, a semiconductor device manufacturing method according to an embodiment of the present invention is described. A substrate is provided to manufacture a semiconductor device. The substrate may include a crystalline semiconductor wafer such as a silicon wafer. The substrate may also include additional layers formed on the crystalline wafer. An object layer is formed on the substrate. The object layer may be, for example, a conductor layer, a semiconductor layer, or an insulator layer. The object layer may be a layer in which it is desired to form a pattern, such as a line, trench, and/or openings by a subsequent process. A photoresist layer is formed on the object layer. The photoresist layer is exposed to a pattern of light which is formed by projecting a light onto a photomask (either through the photomask or reflected from a reflective photomask). The photomask may be made by an embodiment of the present disclosure as described herein. The photoresist layer is developed after it is exposed to the light of pattern to form a photoresist pattern. The object layer may be patterned by an etch process using the photoresist pattern as an etch mask. In some examples, the object layer may be a hard mask layer that is patterned to form a hard mask pattern that is subsequently used to pattern another layer of the wafer. The etch process may be a dry etch process or a wet etch process. After the etching step, the photoresist pattern may be removed by an ashing process and/or a stripping process.

In some embodiments, the object layer may be the crystalline wafer itself so that a pattern is formed on the crystalline wafer by etching the crystalline wafer with a patterned photoresist formed as described herein (e.g., with a photomask of the embodiments described herein).

Another similar method to the above mentioned semiconductor device manufacturing method may be applied to manufacture a semiconductor device as an embodiment of the present disclosure. In this case, the photoresist material itself may remain in the final semiconductor device, for example, as an insulator pattern. Here, the step of removing the photoresist pattern may be skipped from the semiconductor device manufacturing method described above.

Figure 14:
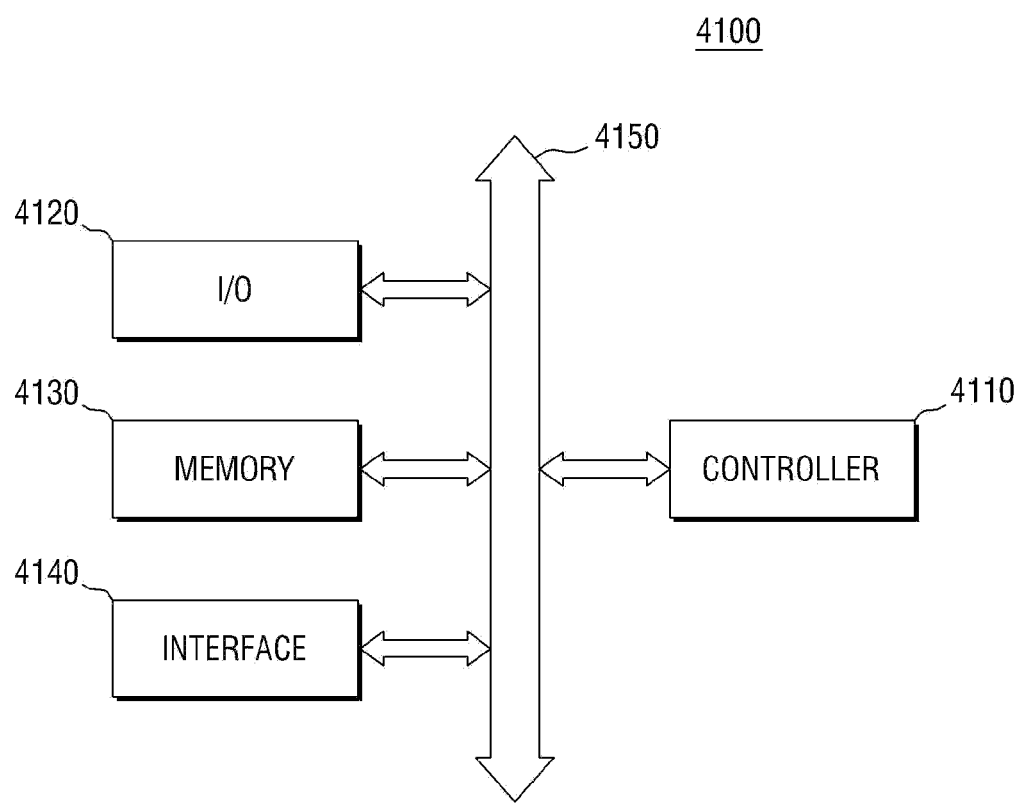
FIG. 14 is a block diagram illustrating an electronic system including a semiconductor device using a mask for photolithography according to some embodiments of the present inventive concept.

FIG. 14 is a block diagram illustrating an electronic system including a semiconductor device using a mask for photolithography according to some embodiments of the present inventive concept.

Referring to FIG. 14, the electronic system 4100 may include a controller 4110, an input/output device (I/O) 4120, a memory device 4130, an interface 4140 and a bus 4150. The controller 4110, the I/O 4120, the memory device 4130 and/or the interface 4140 may be connected to each other through the bus 4150. The bus 4150 corresponds to a path through which data move. In some examples, the interface 4140 may be integrated in the input/output device (I/O) 4120.

The controller 4110 may include at least one of a microprocessor, a digital signal processor, a microcontroller, and a logic element capable of function similar to one of these elements.

The I/O 4120 may include at least one selected from a keypad, a keyboard, a display device, and so on.

The memory device 4130 may store data and/or codes.

The interface 4140 may perform functions of transmitting data to a communication network or receiving data from the communication network. The interface 4140 may be wired or wireless. For example, the interface 4140 may include one or more selected from an antenna, a wired transceiver, a wireless transceiver, and so on.

Although not shown, the electronic system 4100 may further include high-speed DRAM and/or SRAM as a working memory for improving the operation of the controller 4110. The semiconductor devices using a mask for photolithography according to an embodiment of the present inventive concept may be provided in the memory device 4130 or may be provided as one or more components of the controller 4110 or the I/O 4120.

The electronic system 4100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 15:
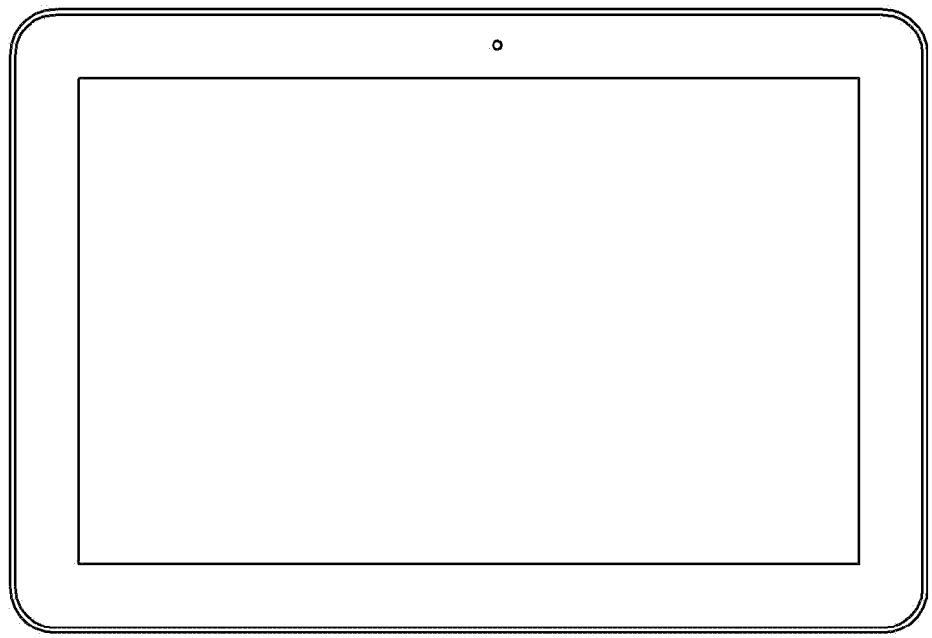
FIGS. 15 and 16 are diagrams of exemplary semiconductor systems to which semiconductor devices using a mask for photolithography according to some embodiments of the present inventive concept are applied.
Figure 16:
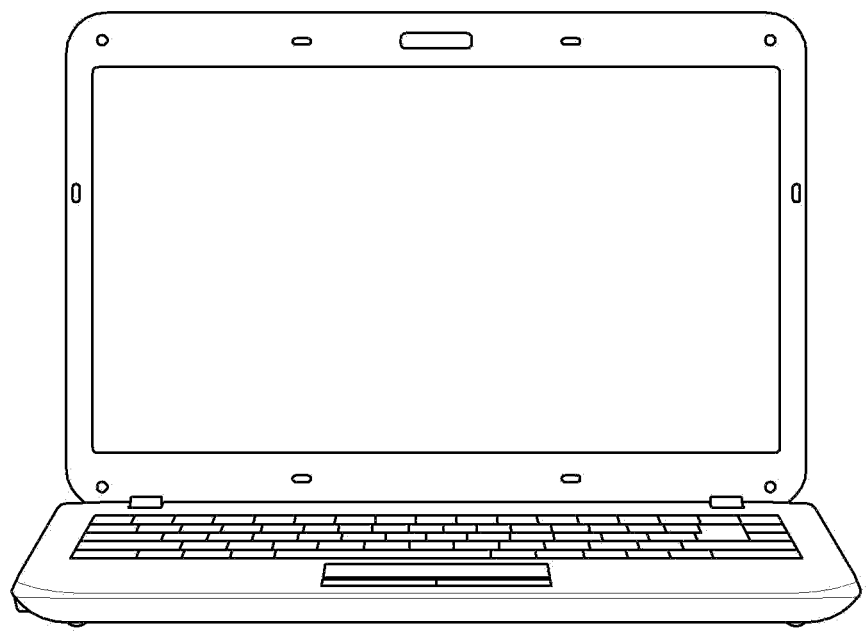

FIGS. 15 and 16 are diagrams of exemplary semiconductor systems to which semiconductor devices using a mask for photolithography according to an embodiment of the present inventive concept is applied.

FIG. 15 illustrates an example in which a semiconductor device according to an embodiment of the present inventive concept is applied to a tablet PC, and FIG. 16 illustrates an example in which a semiconductor device according to an embodiment of the present inventive concept is applied to a notebook computer. At least one of the semiconductor devices using a mask for photolithography according to an embodiment of the present inventive concept can be employed to a tablet PC, a notebook computer, and the like. It is obvious to one skilled in the art that the semiconductor devices using a mask for photolithography according to an embodiment of the present inventive concept may also be applied to other IC devices not illustrated herein.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A method for fabricating a mask for photolithography, the method comprising:
   providing a substrate;
   forming a phase shift material layer on the substrate;
   forming a light blocking layer on the phase shift material layer;
   forming a main pattern on the substrate by removing a portion of the phase shift material layer and a portion of the light blocking layer;
   forming a sub pattern on the substrate by removing a portion of the phase shift material layer and a portion of the light blocking layer; and
   removing the light blocking layer remaining on the main pattern while not removing the light blocking layer remaining on the sub pattern,
   wherein the sub pattern comprises a sub resolution assist feature, and the sub resolution assist feature has small enough dimensions so that it is insufficient to fully block light at any location on a photoresist layer beneath the sub resolution assist feature.

2. The method of claim 1, wherein forming of the main pattern and the sub pattern comprises forming a first photoresist layer pattern on the light blocking layer and removing the phase shift material layer and the light blocking layer on a region exposed by the first photoresist layer pattern.

3. The method of claim 1, wherein the removing of the light blocking layer remaining on the main pattern comprises forming a second photoresist layer pattern to cover the sub pattern and to expose the main pattern.

4. The method of claim 3, wherein the forming of the second photoresist layer pattern comprises forming the second photoresist layer to cover the main pattern and the sub pattern, exposing the second photoresist layer only at one or more regions corresponding to the main pattern, and removing the exposed second photoresist layer.

5. The method of claim 4, wherein the second photoresist layer includes an etch stop layer.

6. The method of claim 1, wherein the sub pattern is spaced apart from the main pattern.

7. The method of claim 6, wherein the sub pattern is shaped to surround the main pattern.

8. The method of claim 1, wherein the phase shift material layer includes molybdenum (Mo) and silicon (Si).

9. The method of claim 1, wherein the light blocking layer includes chrome (Cr).

10. A method of manufacturing a semiconductor device comprising:
    providing a wafer comprising an object layer;
    coating a photoresist layer on the object layer;
    exposing the photoresist layer to a light source through a photo mask;
    developing the photoresist layer to form a photoresist pattern; and
    etching the object layer to form an object layer pattern using the photoresist pattern as an etch mask,
    wherein the photo mask comprises,
       a substrate; and
       a main pattern and a sub pattern formed on the substrate,
       wherein the main pattern comprises a partially transparent phase shift material and the sub pattern comprises an opaque material, and the sub pattern has small enough dimensions so that it is insufficient to fully block light at any location on the photoresist layer under the sub pattern.

11. The method of claim 10, wherein the partially transparent phase shift material further comprises a molybdenum silicide.

12. The method of claim 10, wherein the opaque material comprises chrome.

13. The method of claim 10, wherein the sub pattern further comprises a partially transparent phase shift material.

14. The method of claim 13, wherein the partially transparent phase shift material comprises a phase shift material and a molybdenum silicide and the opaque material comprises chrome.

15. A method of manufacturing a semiconductor device comprising:
    coating a photoresist layer on a wafer substrate;
    exposing the photoresist layer to a light source through a photo mask;
    developing the photoresist layer to form a photoresist pattern; and
    performing an etch corresponding to the photoresist pattern, wherein the photo mask comprises,
   a photo mask substrate;
   a partially transparent pattern formed on the photo mask substrate; and
   a sub resolution assist feature formed on the photo mask substrate,
   wherein the partially transparent pattern comprises a phase shift material and the sub resolution assist feature comprises an opaque material,
   wherein the sub resolution assist feature has small enough dimensions so that the exposing light bends around the sub resolution assist feature and exposes the photoresist layer under the sub resolution assist feature from a first location directly under a first edge of the sub resolution assist feature to a second location directly under a second edge of the resolution assist feature that is opposite to the first edge.

16. The method of claim 15, wherein the partially transparent pattern further comprises a molybdenum silicide, and blocks at least half of light irradiated on the partially transparent pattern to form a shade behind the partially transparent pattern by a light irradiation.

17. The method of claim 15, wherein the opaque material comprises chrome.

18. The method of claim 15, wherein the sub resolution assist feature further comprises a partially transparent phase shift material.

19. The method of claim 18, wherein the partially transparent phase shift material comprises a phase shift material and a molybdenum silicide and the opaque material comprises chrome.

20. The method of claim 15, the portion exposed by the photoresist pattern and etched using the photoresist pattern as a mask is the wafer substrate.

* * * * *